(12) United States Patent
Colli et al.

(10) Patent No.: US 8,927,964 B2
(45) Date of Patent: Jan. 6, 2015

(54) PHOTODETECTION

(71) Applicant: Nokia Corporation, Espoo (FI)

(72) Inventors: Alan Colli, Cambridge (GB); Tim J. Echtermeyer, Cambridge (GB); Anna Eiden, Cambridge (GB); Andrea C. Ferrari, Cambridge (GB)

(73) Assignee: Nokia Corporation, Espoo (FI)

( * ) Notice: Subject to any disclaimer, the term of this patent is extended or adjusted under 35 U.S.C. 154(b) by 189 days.

(21) Appl. No.: 13/681,676

(22) Filed: Nov. 20, 2012

(65) Prior Publication Data

US 2014/0138622 A1    May 22, 2014

(51) Int. Cl.
*H01L 29/06* (2006.01)
*H01L 31/0352* (2006.01)

(52) U.S. Cl.
CPC .............. *H01L 31/0352* (2013.01); *Y02E 10/50* (2013.01)
USPC ................... 257/21; 257/13; 257/40; 257/98; 438/21; 438/22; 438/69; 438/99

(58) Field of Classification Search
None
See application file for complete search history.

(56) References Cited

U.S. PATENT DOCUMENTS

| 2008/0264479 | A1 | 10/2008 | Harris et al. ............... 136/255 |
| 2010/0089443 | A1 | 4/2010 | Bloomstein et al. .......... 136/255 |
| 2010/0276731 | A1* | 11/2010 | Nam et al. .................. 257/184 |
| 2011/0253982 | A1 | 10/2011 | Wang et al. ................. 257/24 |

OTHER PUBLICATIONS

Shanmugam, M. et al.; "Multilayer Graphene Oxide/Cadmium Selenide Quantum-Dot-Coated Titanium Dioxide Heterojunction Solar Cell"; IEEE Electron Device Letters, vol. 33, No. 8; Aug. 2012; pp. 1165-1167.

Chen, Z. et al.; "Energy Transfer from Individual Semiconductor Nanocrystals to Graphene"; arXiv:1003.3027 [physics.chem-ph]; Mar. 15, 2010; pp. 1-17 (relevant sections: abstract, introduction, conclusions).

F. Bonaccorso et al., "Graphene photonics and optoelectronics", Nature Photonics, vol. 4, Sep. 2010, pp. 611-622.

F.T. Vasko et al., "Photoconductivity of intrinsic graphene", The American Physical Society, 2008, 8 pgs.

Park, Jiwoong et al., "Imaging of Photocurrent Generation and Collection in Single-Layer Graphene", Nano Letters, vol. 9, No. 5, 2009, pp. 1742-1746.

Xia, Fengnian, et al., "Photocurrent Imaging and Efficient Photon Detection in a Graphene Transistor", Nano Letters, Feb. 2009, 7 pgs.

Dawlaty, Jahan et al., "Measurement of the optical absorption spectra of epitaxial graphene from terahertz to visible", Applied Physics Letters 93, 2008, 3 pgs.

Xia, Fengnian, et al., "Ultrafast graphene photodetector", Nature Technology, vol. 4, Dec. 2009, pp. 839-843.

(Continued)

*Primary Examiner* — Kyoung Lee
(74) *Attorney, Agent, or Firm* — Harrington & Smith

(57) ABSTRACT

Apparatus and methods are provided. A first apparatus includes: a semiconductor film; and at least one semiconductor nanostructure, including a heterojunction, configured to modulate the conductivity of the semiconductor film by causing photo-generated carriers to transfer into the semiconductor film from the at least one semiconductor nanostructure. A second apparatus includes: a semimetal film; and at least one semiconductor nanostructure, including a heterojunction, configured to generate carrier pairs in the semimetal film via resonant energy transfer, and configured to generate an external electric field for separating the generated carrier pairs in the semimetal film.

19 Claims, 6 Drawing Sheets

(56) References Cited

OTHER PUBLICATIONS

Jander, Sebastian, et al., "Energy Transfer from CdSe/Cds Nanorods to Amorphous Carbon", American Chemical Society, 2011, 5 pgs.

Mueller, Thomas, et al., "Graphene photodetectors for high-speed optical communications", Nature Photonics, Mar. 2010, 5 pgs.

Chen, Zheyuan, et al., "Energy Transfer from Individual Semiconductor Nanocrystals to Graphene", American Chemical Society, 2010, 5 pgs.

Lin, Yue, et al., "Dramatically Enhanced Photoresponse of Reduced Graphene Oxide with Linker-Free Anchored CdSe Nanoparticles", American Chemical Society, 2010, 6 pgs.

Yuan, Chi-Tsu, et al., "Single-Particle Studies of Band Alignment Effects on Electron Transfer Dynamics from Semiconductor Heteronanostructures to Single-Walled Carbon Nanotubes", American Chemical Society, 2012, 7 pgs.

Konstantatos, Gerasimos, et al., "Hybrid graphene-quantum dot phototransistors with ultrahigh gain", Nature Nanotechnology, May 2012, 6 pgs.

Mueller, T., et al., "Role of contacts in graphene transistors: A scanning photocurrent study", The American Physical Society, 2009, 6 pgs.

Echtermeyer, T.J., et al., "Strong plasmonic enhancement of photovoltage in graphene", Nature Communications, 2011, 5 pgs.

Liu, Yuan, et al., "Plasmon resonance enhanced multicolour photodetection by graphene", Nature Communications, 2011, 7 pgs.

Figuerola, Albert, et al., "Epitaxial CdSe-Au Nanocrystal Heterostructures by Thermal Annealing", American Chemical Society, 2010, 9 pgs.

Konstantatos, Gerasimos, et al., "Solution-Processed Quantum Dot Photodetectors", IEEE, vol. 97, No. 10, Oct. 2009; pp. 1666-1683.

* cited by examiner

PHOTODETECTION

TECHNOLOGICAL FIELD

Embodiments of the present invention relate to photodetection. In particular, they relate to photodetection using semiconductor nanostructures.

BACKGROUND

A photodetector detects light by converting light incident upon it into electrical current.

BRIEF SUMMARY

According to various, but not necessarily all, embodiments of the invention there is provided an apparatus, comprising: a semiconductor film; and at least one semiconductor nanostructure comprising a heterojunction configured to modulate the conductivity of the semiconductor film by assisting photo-generated carriers to transfer into the semiconductor film from the at least one semiconductor nanostructure.

The semiconductor film may be graphene. The heterojunction may assist photo-generated carriers to transfer into the semiconductor film by separating them in the at least one semiconductor nanostructure. The heterojunction may be a type-II heterojunction.

The transfer of photo-generated carriers into the semiconductor film from the at least one semiconductor nanostructure may generate an electric field which modulates the conductivity of the semiconductor film.

The at least one semiconductor nanostructure may comprise first and second semiconductor nanomaterials that form the heterojunction.

The first and second semiconductor nanomaterials may be arranged relative to the semiconductor film such that photo-generated carriers are transferred from the second semiconductor nanomaterial to the semiconductor film, and not from the first semiconductor nanomaterial to the semiconductor film.

The second semiconductor nanomaterial may be in direct contact with the semiconductor film. The first semiconductor nanomaterial might not be in contact with the semiconductor film. The first semiconductor nanomaterial may be encased within the second semiconductor nanomaterial.

The apparatus may further comprise: an electrical bridge extending from the second semiconductor nanomaterial to the semiconductor film. The electrical bridge may be or comprise a metal. The metal may be or comprise one or more of: gold, platinum, palladium, nickel or copper.

According to various, but not necessarily all, embodiments of the invention there is provided a method, comprising: using a heterojunction of at least one semiconductor nanostructure to modulate the conductivity of a semiconductor film by assisting photo-generated carriers to transfer into the semiconductor film from the at least one semiconductor nanostructure.

The heterojunction may assist photo-generated carriers to transfer into the semiconductor film by separating them in the at least one semiconductor nanostructure. The heterojunction may be a type-II heterojunction.

The transfer of photo-generated carriers into the semiconductor film from the at least one semiconductor nanostructure may generate an electric field which modulates the conductivity of the semiconductor film.

According to various, but not necessarily all, embodiments of the invention there is provided an apparatus, comprising: a semimetal film; and at least one semiconductor nanostructure, comprising a heterojunction, configured to generate carrier pairs in the semimetal film via resonant energy transfer, and configured to generate an external electric field for separating the generated carrier pairs in the semimetal film.

The semimetal film may be graphene. The heterojunction may be a type-II heterojunction. The heterojunction may be configured to generate the external electric field by separating photo-generated carrier pairs. The carrier pairs in the semimetal may be generated via resonant energy transfer from photo-generated carrier pairs in the at least one semiconductor nanostructure.

The apparatus may further comprise a barrier between the at least one semiconductor nanostructure and the semiconductor film. The external electric field may be generated by separating the photo-generated carrier pairs bound within the at least one semiconductor nanostructure by the barrier. The external electric field may be approximately an electric dipole field. The at least one semiconductor nanostructure may be configured to generate the external electric field by assisting photo-generated carriers to transfer into the semimetal film from the at least one semiconductor nanostructure.

The at least one semiconductor nanostructure may comprise a first semiconductor nanomaterial and a second semiconductor nanomaterial that form the heterojunction. The heterojunction may extend in a direction that is substantially perpendicular to the directions of movement of the generated carrier pairs in the semimetal film.

The heterojunction may assist photo-generated carriers to transfer into the semiconductor film by separating them in the at least one semiconductor nanostructure.

The at least one semiconductor nanostructure may comprise first and second semiconductor nanomaterials that form the heterojunction. The first and second semiconductor nanomaterials may be arranged relative to the semiconductor film such that photo-generated carriers are transferred from the second semiconductor nanomaterial to the semiconductor film, and not from the first semiconductor nanomaterial to the semimetal film.

The second semiconductor nanomaterial may be in direct contact with the semimetal film. The first semiconductor nanomaterial might not be in contact with the semimetal film. The first semiconductor nanomaterial may be encased within the second semiconductor nanomaterial.

The apparatus may further comprise at least one further semiconductor nanostructure, comprising a further heterojunction, configured to generate further carrier pairs in the semimetal film via resonant energy transfer, and configured to generate a further external electric field for separating the further generated carrier pairs in the semimetal film.

The at least one semiconductor nanostructure may be configured to generate carrier pairs in the semimetal film via resonant energy transfer from photo-generated carrier pairs generated in the at least one semiconductor nanostructure in response to reception of light having a frequency equal to or above a first frequency threshold.

The at least one further semiconductor nanostructure may be configured to generate further carrier pairs in the semimetal film via resonant energy transfer from photo-generated carrier pairs generated in the at least one further semiconductor nanostructure in response to reception of light having a frequency equal to or above a second frequency threshold, which is lower than the first frequency threshold.

Current in the semimetal film may be produced in response to reception of light by the at least one semiconductor nanostructure and the at least one further semiconductor nanostructure having a frequency below the first frequency threshold and above or equal to the second frequency threshold, and current in the semimetal might not be produced in response to reception of light by the at least one semiconductor nanostructure and the at least one further semiconductor nanostructure having a frequency equal to or above the first frequency threshold and below the second frequency threshold.

According to various, but not necessarily all, embodiments of the invention there is provided a method, comprising: using at least one semiconductor nanostructure, comprising a heterojunction, to generate carrier pairs in a semimetal film via resonant energy transfer; and using the heterojunction to generate an external electric field for separating the generated carrier pairs in the semimetal film.

The external electric field may be generated by the heterojunction separating photo-generated carrier pairs.

BRIEF DESCRIPTION

For a better understanding of various examples that are useful for understanding the brief description, reference will now be made by way of example only to the accompanying drawings in which.

Figure 1:
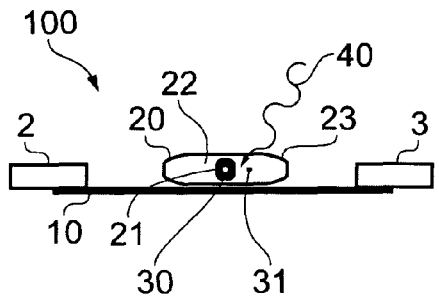
FIG. 1 illustrates an apparatus comprising a semiconductor film and a semiconductor nanostructure.
Figure 3:
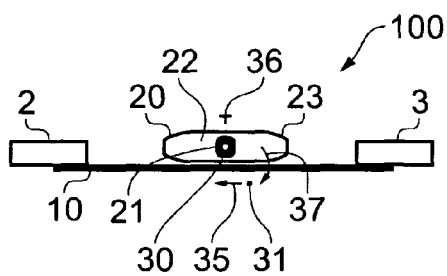
FIG. 3 illustrates the apparatus illustrated in FIG. 1 following photon reception.
Figure 4:
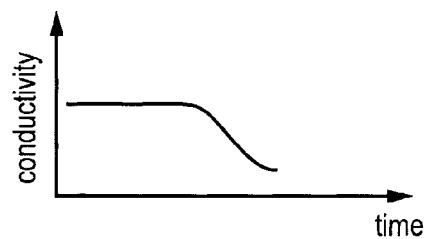
Figure 5:
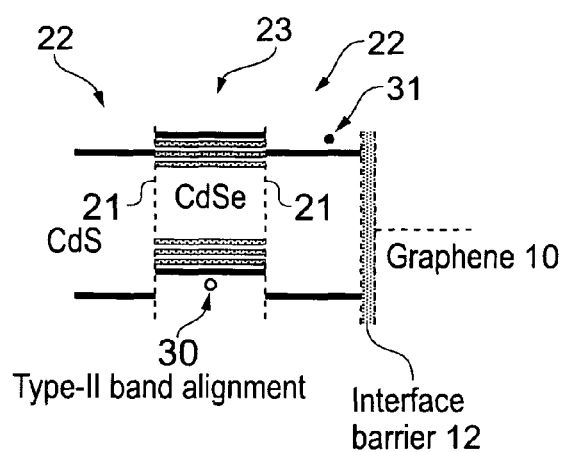
Figure 6:
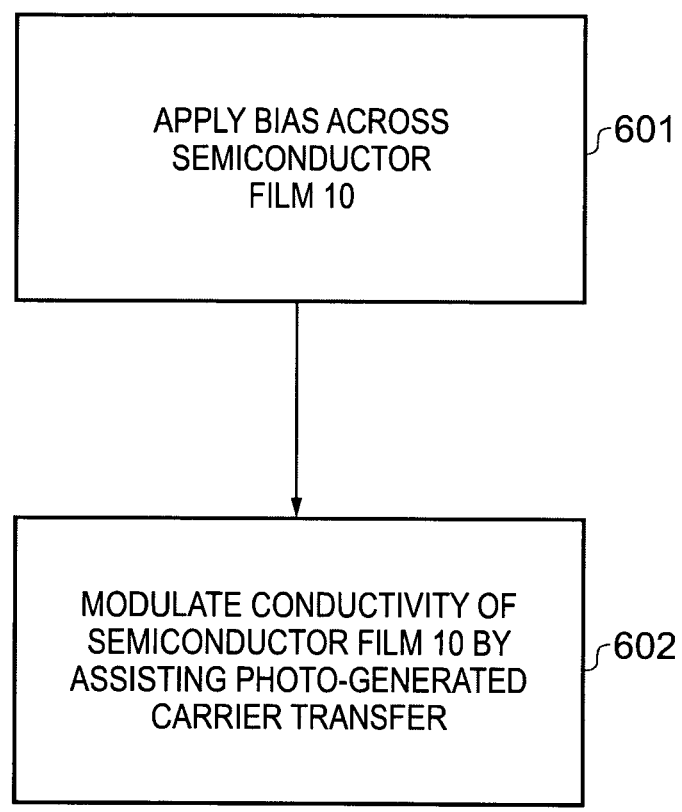
Figure 7:
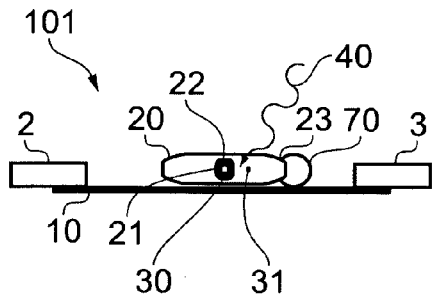
Figure 8:
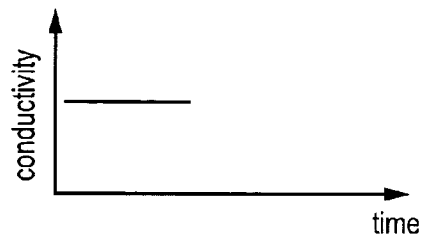
Figure 9:
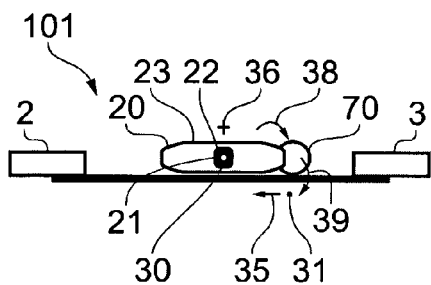
Figure 10:
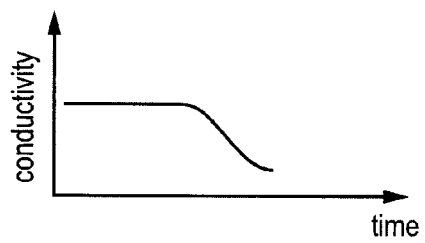
Figure 11:
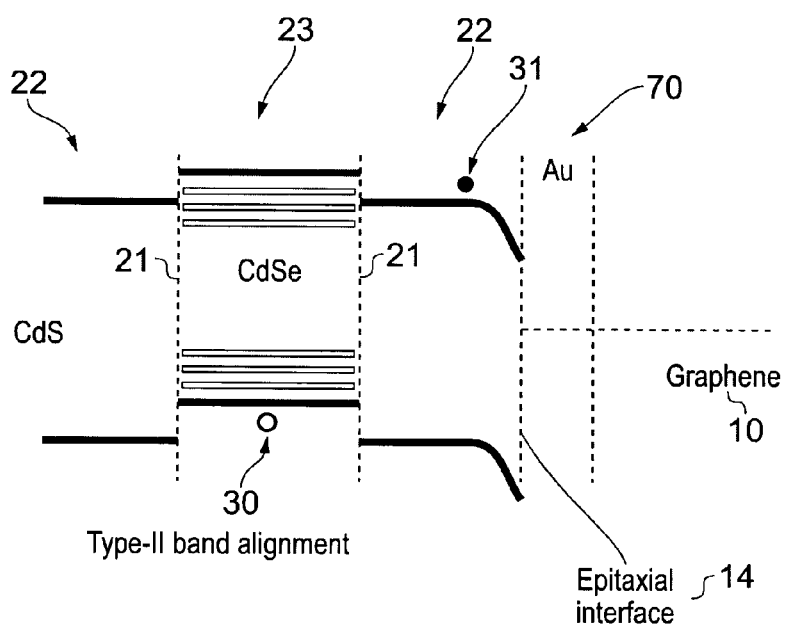
Figure 12:
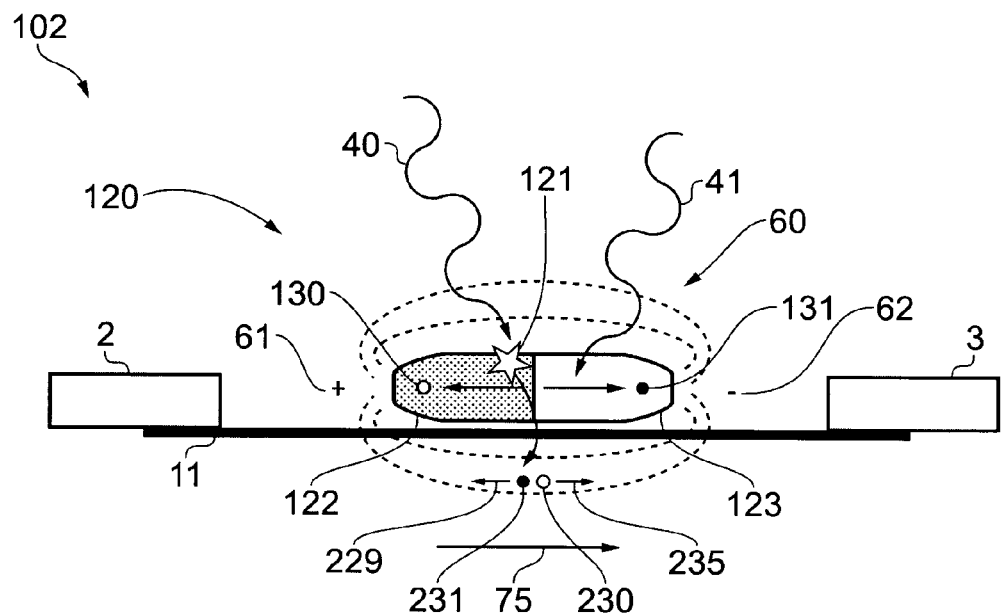
Figure 13:
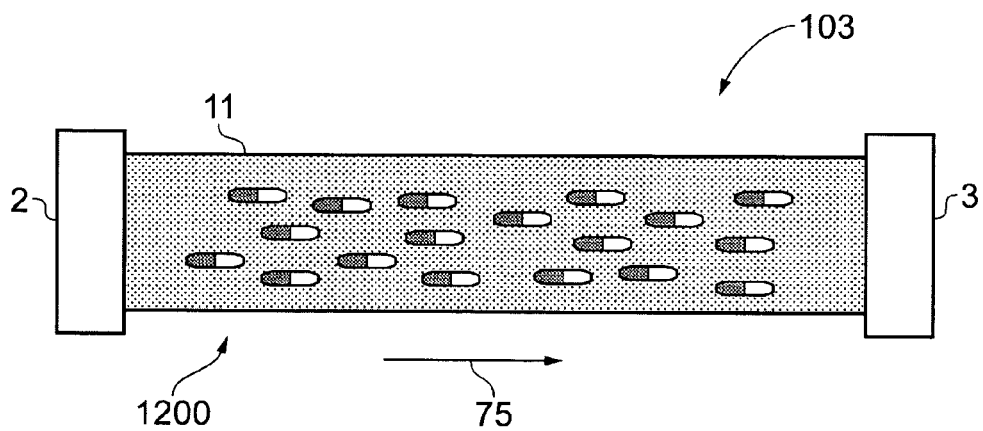
Figure 14:
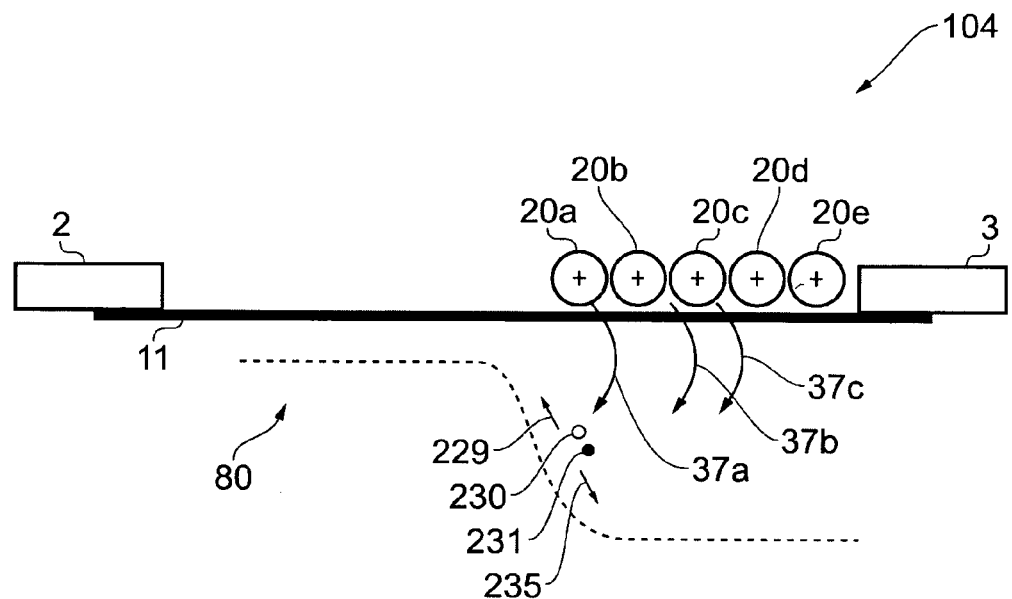
Figure 15:
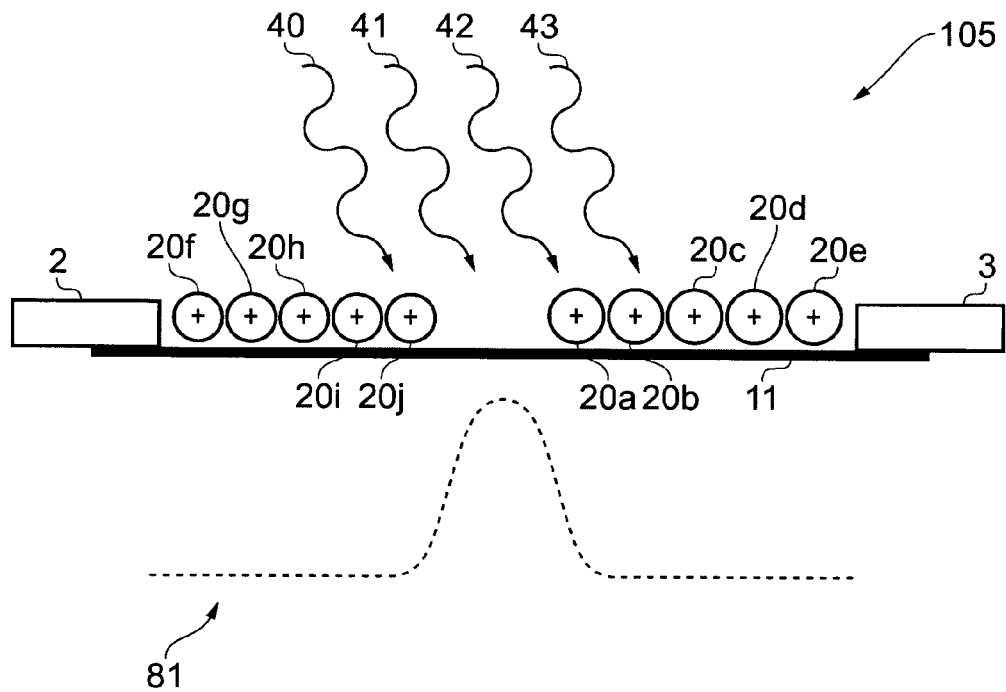
Figure 16:
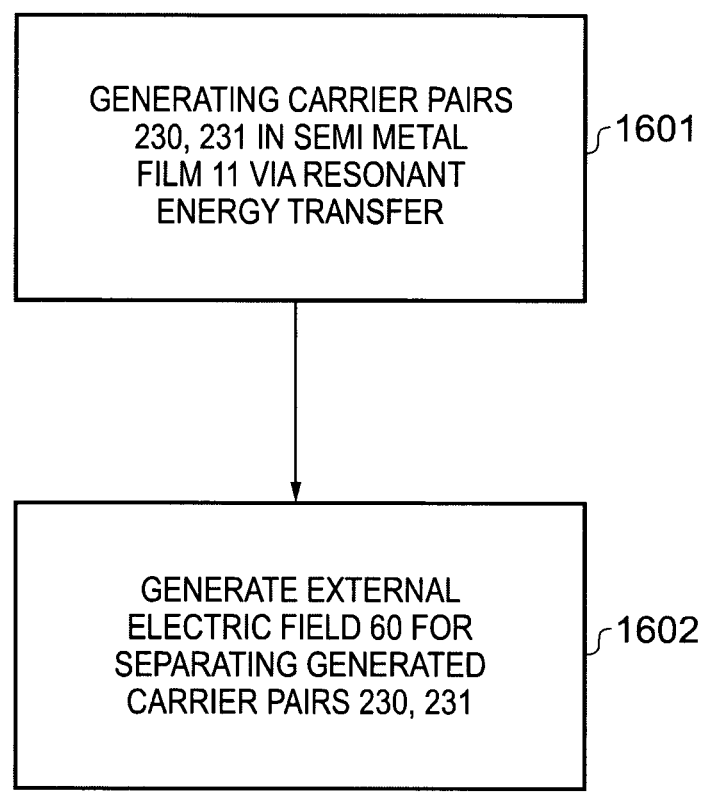

FIG. 4 a graph of conductivity versus time following reception of light at the apparatus illustrated in FIG. 1;

FIG. 5 illustrates an example of an energy band diagram for the apparatus illustrated in FIGS. 1 and 3;

FIG. 6 illustrates a flow chart of a first method;

FIG. 7 illustrates an apparatus comprising a semiconductor film, a semiconductor nanostructure and an electrical bridge connecting the semiconductor film and the semiconductor nanostructure;

FIG. 8 illustrates a graph of conductivity versus time before the apparatus illustrated in FIG. 7 begins to receive light;

FIG. 9 illustrates the apparatus illustrated in FIG. 7 following photon reception;

FIG. 10 a graph of conductivity versus time following reception of light at the apparatus illustrated in FIG. 7;

FIG. 11 illustrates an example of an energy band diagram for the apparatus illustrated in FIGS. 7 and 9;

FIG. 12 illustrates an apparatus comprising a semimetal film and a semiconductor nanostructure;

FIG. 13 illustrates a plan view of an apparatus comprising a semimetal film and multiple semiconductor nanostructures;

FIG. 14 illustrates an apparatus comprising an apparatus comprising a semimetal film and multiple semiconductor nanostructures;

FIG. 15 illustrates an apparatus comprising an apparatus comprising a semimetal film, a first set of semiconductor nanostructures and a second set of semiconductor nanostructures; and FIG. 16 illustrates a flow chart of a second method.

DETAILED DESCRIPTION

Embodiments of the invention relate to photodetection using semiconductor nanostructures.

The figures illustrate an apparatus 100/101, comprising: a semiconductor film 10; and at least one semiconductor nanostructure 20, comprising a heterojunction 21, configured to modulate the conductivity of the semiconductor film 10 by assisting photo-generated carriers 31 to transfer into the semiconductor film 10 from the at least one semiconductor nanostructure 20.

The figures also illustrate an apparatus 102/103/104/105, comprising: a semimetal film 11; and at least one semiconductor nanostructure 20/120/20a-20e/20a-20j, comprising a heterojunction 21/121, configured to generate carrier pairs 230,131 in the semimetal film 11 via resonant energy transfer, and configured to generate an external electric field 60 for separating the generated carrier pairs 230, 231 in the semimetal film 11.

FIG. 1 illustrates a cross-section of first apparatus 100 comprising a semiconductor film 10 and a semiconductor nanostructure 20. The semiconductor nanostructure 20 is located on the semiconductor film 10 between two electrical contacts 2, 3.

The example in FIG. 1 showing a single semiconductor nanostructure 20 between the electrical contacts 2, 3 is illustrative. It will be appreciated by those skilled in the art that, in practice, there may be multiple semiconductor nanostructures 20 located between the electrical contacts 2, 3.

In this example, the semiconductor film 10 is graphene. Graphene is both a zero-gap semiconductor and a semimetal. In other examples the semiconductor film 10 may, for example, be silicon.

The semiconductor nanostructure 20 comprises a first semiconductor nanomaterial 22 and a second semiconductor nanomaterial 23 that form a type-II (staggered gap) heterojunction 21. In the illustrated example, the semiconductor nanostructure 20 is a nanorod. The first semiconductor nanomaterial 22 is encased (wholly) within the second semiconductor nanomaterial 23.

The first semiconductor nanomaterial 22 is not in contact with the semiconductor film 10 in FIG. 1. It is separated from the semiconductor film 10 by the second semiconductor nanomaterial 23.

The second semiconductor nanomaterial 23 is considered to be directly in contact with the semiconductor film 10. A layer of extrinsic material might be located between the second semiconductor nanomaterial 23 and the semiconductor film 10, the presence of which is difficult, inconvenient or impossible to avoid. The layer of extrinsic material may include the native oxide of the semiconductor nanostructure 20, residual organic ligand from the nanostructure synthesis process, and/or absorbed water or molecules from the environment. The layer of extrinsic material is limited to a thickness of 5 nanometers (and preferably less).

In operation, when light is incident upon the semiconductor nanostructure 20, carrier pairs (electron-hole pairs) are generated within the nanostructure 20. FIG. 1 illustrates an example in which an incident photon 40 generates a carrier pair 30, 31 within the semiconductor nanostructure 20. In the FIG. 1 illustration, an electron 31 is shown in the second semiconductor nanomaterial 23 and a hole 30 is shown in the first semiconductor nanomaterial 22.

The built-in field of the heterojunction 21 causes one type of carrier (electrons or holes) 30, 31 to separate from the other. This prevents fast recombination in the nanostructure 20 and assists electrons or holes to transfer into the semiconductor film 10 by providing more time for tunneling to occur between the nanostructure 20 and the film 10. In the example illustrated in FIG. 3, the electron 31 is illustrated as having tunneled into the semiconductor film 10. The arrow labeled with the reference numeral 37 illustrates the transfer of the electron 31 into film 10.

The transfer of a carrier 31 into the film generates an electric field between the nanostructure 20 and the film 10, which modulates (increases or reduces) the conductivity of the film 10. In this example, the conductivity of the film 10 is reduced when an electron 31 tunnels into the film 10 leaving a positively charged ion behind (as illustrated by the plus sign 36 in FIG. 3). The hole 30 does not transfer into the film 10 because it is positioned in the first semiconductor nanomaterial 22 which is separated from the film 10 by the second semiconductor material 23. An electric field is therefore generated that is directed from the nanostructure 20 to the film 10.

If a bias is applied across the film 10 using the contacts 2, 3, carriers that are transferred into the film 10 will flow across the film 10 between the contacts 2, 3. FIG. 3 illustrates a situation in which the first contact 2 is positively charged relative to the second contact 3, causing movement of the transferred electron 31 towards the first contact 2, as illustrated by the arrow 35.

Figure 2:
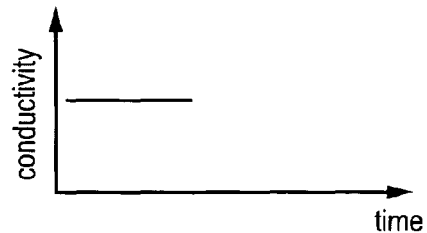
FIG. 2 illustrates a graph of conductivity versus time before the apparatus illustrated in FIG. 1 begins to receive light.

FIG. 6 illustrates a flow chart according to a first method. At block 601 in FIG. 6, a bias is applied across the semiconductor film 10 via the contacts 2, 3, prior to light being received by the semiconductor nanostructure 20. In this example, the application of the bias results in current flowing from the first contact 2 to the second contact 3. FIG. 2 illustrates that, at this point in time, the conductivity of the film 10 is substantially constant.

At block 602 in FIG. 6, light is received at the nanostructure 20, which results in charge transfer to the film 10. The electric field that is generated from the charge transfer modulates the conductivity of the film 10 which, in this example, reduces the conductivity of the film 10 as shown in the graph illustrated in FIG. 4. The extent to which the conductivity of the film 10 is modulated depends upon the photon flux that is incident upon the semiconductor nanostructure 20. The rate at which the conductivity of the film 10 is modulated depends upon the amount of extrinsic material located between the semiconductor nanostructure 20 and the semiconductor film 10. A thinner extrinsic material barrier results in better carrier transfer into the film 10, and a greater rate of change in conductivity.

In effect, the semiconductor nanostructure 20 acts as a photo-gate which is used to control the conductivity of a conductive channel, provided by the semiconductor film 10, between the contacts 2, 3.

Advantageously, as described above, the heterojunction 21 in the semiconductor nanostructure 20 assists in the separation of photo-generated electrons and holes within the nanostructure 20, preventing fast recombination. This provides more time for electrons or holes to transfer into the semiconductor film 10 and alter the conductivity of the film 10.

In one example, the first semiconductor nanomaterial 22 may be cadmium sulfide (CdS), the second semiconductor nanomaterial 23 may be cadmium selenide (CdSe) and the semiconductor film 10 is graphene. FIG. 5 illustrates an energy band diagram for such an example. An interface barrier 12 of extrinsic material is shown on the diagram. As mentioned above, the thickness of the interface barrier 12 is 5 nanometers or less.

FIGS. 7 to 11 illustrate an embodiment of the invention which is similar to the embodiment illustrated in FIGS. 1 to 6 and described above. A second apparatus 101 is illustrated in FIGS. 7 and 9 which differs from the first apparatus 100 illustrated in FIGS. 1 and 3 in that it further comprises an electrical bridge 70. The electrical bridge 70 extends from the second semiconductor nanomaterial 23 to the semiconductor film 10.

The electrical bridge 70 may be a metal. Preferably the metal used does not oxidize easily upon exposure to air. Metals such as gold, platinum, palladium, nickel and copper are suitable.

The electrical bridge 70 advantageously assists photo-generated carriers to transfer into the semiconductor film 10 from the nanostructure 20. An arrow 38 in FIG. 9 illustrates an electron 31 transferring into the electrical bridge 70 from the second semiconductor nanomaterial 23. A further arrow 39 in FIG. 9 illustrates the electron 31 transferring into the semiconductor film 10 from the electrical bridge 70.

The graph in FIG. 8 illustrates the conductivity of the semiconductor film 10 in this embodiment prior to light being received at the nanostructure. The graph in FIG. 10 illustrates the decrease in the conductivity of the semiconductor film 10 when light is received at the nanostructure 20. Advantageously, the rate at which the conductivity of the film 10 is modulated in this embodiment is greater than in the embodiment described above in relation to FIGS. 1 to 5, due to the presence of the electrical bridge 70.

FIG. 11 illustrates an energy band diagram for this embodiment of the invention, where the first semiconductor nanomaterial 22 is cadmium sulfide (CdS), the second semiconductor nanomaterial 23 is cadmium selenide (CdSe), the electrical bridge 70 is made from gold (Au) and the semiconductor film 10 is graphene. An epitaxial interface 14 is illustrated between the second semiconductor nanomaterial 23 and the electrical bridge 70.

FIG. 12 illustrates a cross-section of a third apparatus 102 which comprises a semimetal film 11 and a semiconductor nanostructure 120. The semimetal film 11 may, for example, be graphene. In the illustrated example, the semiconductor nanostructure 120 is a nanorod.

The semiconductor nanostructure 120 is located on the semimetal film 11 between a first electrical contact 2 and a second electrical contact 3. Unlike the embodiments described above in relation to FIGS. 1 to 11, in this embodiment a bias is not applied across the contacts 2, 3 in operation.

The semiconductor nanostructure 120 is configured to generate carrier pairs 230, 231 in the semimetal film 11 via resonant energy transfer, and configured to generate an external electric field 60 for separating the generated carrier pairs 230, 231 in the semimetal film 11. This is described in further detail below.

The semiconductor nanostructure 120 illustrated in FIG. 12 comprises a first semiconductor nanomaterial 122 and a second semiconductor nanomaterial 123 which form a type-II (staggered gap) heterojunction 121. In the illustration, the heterojunction 121 extends in a direction that is substantially perpendicular to the illustrated semimetal film 11. In the illustrated example, the semiconductor nanostructure 120 is a nanorod. The illustrated heterojunction 121 passes through the center of nanostructure 120 and divides it in two.

The apparatus 10 further comprises a barrier (not shown in FIG. 12) that separates both the first semiconductor nanomaterial 122 and the second semiconductor nanomaterial 123 from the semimetal film 11. The barrier may, for example, be 5 nanometers or greater in thickness and is intended to mitigate or prevent charge transfer between the semiconductor nanostructure 120 and the semimetal film 11.

In operation, when light is incident upon the semiconductor nanostructure 120 (as illustrated by the photons 40, 41), carrier pairs (electron-hole pairs) are generated within the nanostructure 120. The built-in field of the heterojunction 121 causes the photo-generated electrons to separate from the photo-generated holes. FIG. 12 illustrates an example in which an incident photon 40 generates a carrier pair 130, 131 within the semiconductor nanostructure 120. In the FIG. 12 illustration, the electron 131 is shown in the second semiconductor nanomaterial 123 and the hole 130 is shown in the first semiconductor nanomaterial 122.

The photo-generated carrier pairs are bound within the semiconductor nanostructure 120. The thickness of the barrier between the nanostructure 120 and the film 11 is such that the photo-generated carrier pairs cannot pass into the semimetal film 11, or such that it is highly improbable that they will do so.

A photo-generated carrier (electron-hole) pair in the semiconductor nanostructure 120 can recombine without emitting a photon and instead exciting, via near field coupling, an equivalent carrier (electron-hole) pair in the semimetal film 11. This is known as resonant energy transfer.

The separation of photo-generated electrons from photo-generated holes in the semiconductor nanostructure 120 generates an electric field 60 external to semiconductor nanostructure 120. The electric field in this example is null within the nanostructure 120 and outside the nanostructure 120 the electric field 60 is approximately a dipole electric field, as illustrated in FIG. 12. The external electric field 60 is directed from the first semiconductor nanomaterial 122 to the second semiconductor nanomaterial 123, as shown in FIG. 12 by the plus and minus signs 61, 62.

The external electric field 60 separates the carrier pairs in the semimetal film 11 generated via resonant energy transfer. FIG. 12 illustrates a hole 231 moving through the semimetal film 11 towards a first contact 2 under the influence of the external electric field 60 (see the arrow 229). FIG. 12 also illustrates an electron 235 moving through the semimetal film 11 towards a second contact 3 under the influence of the external electric field 60 (see the arrow 235).

The movement of electrons and holes in the semimetal film 11 causes a current to be generated in the semimetal film 11, as illustrated by the arrow 75 in FIG. 12. The direction of the current 75 therefore depends upon the direction of the electric field 60 generated by the semiconductor nanostructure 120, which in turn depends upon the orientation of the heterojunction 121 in the nanostructure 120. It can be seen in FIG. 12 that the heterojunction 121 extends in a direction that is substantially perpendicular to the directions of movement of the carrier pairs in the film 11 (and is therefore perpendicular to the direction of current flow).

FIG. 13 illustrates an fourth apparatus 103 which comprises multiple semiconductor nanostructures 1200 between the contacts 2, 3, where each semiconductor nanostructure has the same form as the semiconductor nanostructure 120 illustrated in FIG. 12 and described above.

Each of the multiple semiconductor nanostructures 1200 is aligned with the same polarity in FIG. 13: the first semiconductor nanomaterial 122 in each nanostructure is closer to the first contact 2 than the second contact 3, and the second semiconductor nanomaterial 123 in each nanostructure is closer to the second contact 3 than the first contact 2. Each of the nanostructures in FIG. 13 is arranged sufficiently far apart to avoid mutual electrical field compensation between adjacent nanostructures.

In operation, when light is incident upon the semiconductor nanostructures 1200, a current 75 flows through the semimetal film 11, from the first contact 2 to the second contact 3.

Advantageously, the third and fourth apparatus 102, 103 operate as a photodetector without the need for an electrical power input (due to absence of an applied bias across the contacts 2, 3).

FIG. 14 illustrates a fifth apparatus 104 which comprises a semimetal film 11 and multiple semiconductor nanostructures 20a-20e. The semimetal film 11 may, for example, be graphene.

The semiconductor nanostructures 20a-20e are located on the semimetal film 11 between a first contact 2 and a second contact 3. In this example, the semiconductor nanostructures 20a-20e are positioned in a region that is closer to the second contact 3 than the first contact 2. A bias is not applied across the contacts 2, 3 in operation.

Each of the semiconductor nanostructures 20a-20e has the same form as the semiconductor nanostructure 20 illustrated in FIGS. 1 and 3 or FIGS. 7 and 9. Each of the semiconductor nanostructures 20a-20e is considered to be in contact with the semimetal film 11. As in the FIGS. 1 to 11 embodiments described above, there may be an interface layer 12, 14 between the nanostructures 20a-20e and the film 11, or between the nanostructures 20a-20e and the electrical bridge 70 (if any).

When light is received at the semiconductor nanostructures 20a-20e, carrier pairs (electron-hole pairs) are generated within the nanostructures 20a-20e. As described above in relation to FIGS. 1 to 11, the built-in field of the heterojunction 21 in each nanostructure 20a-20e causes one type of carrier (electrons or holes) to separate from the other. This prevents fast recombination in the nanostructure 20a-20e and assists electrons or holes to transfer into the semimetal film 11 by providing more time for tunneling to occur between a nanostructure and the film 11.

The transfer of carriers into the film 11 from the semiconductor nanostructures 20a-20e generates an electric field between the nanostructures 20a-20e and the film 11, which reduces the conductivity of the film 11. In this example, electrons tunnel into the film 11 leaving positively charged ions, as illustrated by the plus sign 36 in each of the nanostructures 20a-20e in FIG. 14. This causes an external electric field to be generated that is directed from the nanostructures 20a-20e to the film 11. The presence of the electric field changes the energy band profile 80 of the semimetal film 11, lowering it in the region where the semiconductor nanostructures 20a-20e are positioned. The altered energy band profile 80 of the film 11 is illustrated by a dotted line in FIG. 14.

There is a maximum charge that each nanostructure 20a-20e can store. This can be considered to be the "saturation value". Saturation occurs because, beyond a certain point, the external electric field that is generated between the nanostructures 20a-20e and the film 11 hinders the transfer of the carriers between nanostructures 20a-20e and the film 11. A dynamic equilibrium will form between photo-generated carriers transferring from the nanostructures 20a-20e to the film 11 and carriers transferring back from the film 11 to the nanostructures 20-20e due to the external electric field.

Resonant energy transfer also takes place when light is received at the semiconductor nanostructures 20a-20e. As explained above, in resonant energy transfer, photo-generated carrier (electron-hole) pairs recombine in the nanostructures 20a-20e without emitting a photon and instead exciting, via near field coupling, an equivalent carrier (electron-hole) pair in the semimetal film 11.

Once charge transfer between has taken place between the nanostructures 20a-20e and the film 11 such that there is an electric field between them (and the energy band profile 80 of the film 11 has been adjusted), the movement of electrons and holes generated in the film 11 by resonant energy transfer is influenced by the electric field. This produces a current between the contacts 2, 3 when light is incident upon the nanostructures 20a-20e.

FIG. 14 illustrates a hole 229 and an electron 230 being guided along the energy band profile 80 (see the arrows 229 and 235). The direction of the current that is produced is from the second contact 3 towards to the first contact 2.

Advantageously, the fifth apparatus 104 operates as a photodetector without the need for an electrical power input (due to the absence of an applied bias across the contacts 2, 3 in operation).

FIG. 15 illustrates a sixth apparatus 105 which comprises a semimetal film 11, a first set of semiconductor nanostructures 20a-20e located on the semimetal film 11 and a second set of semiconductor nanostructures 20f-20j located on the semimetal film 11. FIG. 15 also illustrates a series of photons 40-43 incident upon the apparatus 105.

The first set and second sets of semiconductor nanostructures 20a-20e, 20f-20j are located on the semimetal film 11 between first and second contacts 2, 3, but the first set 20a-20e is separated from the second set 20f-20j. A bias is not applied across the contacts 2, 3 in operation.

The form of the semiconductor nanostructures 20a-20e in the first set is different from the form of the semiconductor nanostructures 20f-20j; each of the semiconductor nanostructures 20a-20e in the first set has a different band gap from the semiconductor nanostructures 20f-20j in the second set.

The first set of semiconductor nanostructures 20a-20e may, for example, be made from different material(s) from the second set of semiconductor nanostructures 20f-20j.

Each of the semiconductor nanostructures 20a-20e in the first set is sensitive to light having a frequency equal to or above a first threshold. That is, photo-generated carrier pairs are generated in the first set of semiconductor nanostructures 20a-20e in response to reception of light having a frequency equal to or above the first threshold.

Each of the semiconductor nanostructures 20f-20j in the second set is sensitive to light having a frequency equal to or above a second threshold. That is, photo-generated carrier pairs are generated in the second set of semiconductor nanostructures 20f-20j in response to reception of light having a frequency equal to or above the second threshold. The second frequency threshold is lower than the first frequency threshold.

When light having a frequency lower than the both the first frequency threshold and the second frequency threshold is incident upon the first and second sets of semiconductor nanostructures 20a-20j, no photo-generated carrier pairs are produced in the nanostructures 20a-20j and therefore no current flows between the contacts 2, 3.

When light is incident upon the first and second sets of semiconductor nanostructures 20a-20j which has a frequency equal to or higher than the first frequency threshold (and therefore also higher than the second frequency threshold) photo-generated carrier pairs are produced in both the first set and the second set of nanostructures 20a-20e, 20f-20j. The transfer of carriers between the first set of nanostructures 20a-20e and the film 11, and between the second set of nanostructures 20f-20j and the film 11, causes a change to the energy band profile 81 of the semimetal film 11. FIG. 15 illustrates the energy band profile of the semimetal film 11 in this situation.

The movement of carrier pairs that are generated in the film 11 via resonant energy transfer is influenced by the altered energy band profile 81 of the film 11. Electrons generated in the film 11 from the first set of nanostructures 20a-20e are guided towards the second contact 3. Holes generated in the film 11 from the first set of nanostructures 20a-20e are guided towards the first contact 2. Conversely, electrons generated in the film 11 from the second set of nanostructures 20f-20e are guided towards the first contact 2. Holes generated in the film 11 from the second set of nanostructures 20f-20j are guided towards the second contact 3.

Consequently, the current that is generated by the first set of nanostructures 20a-20e is cancelled out by the current that is generated by the second set of nanostructures 20f-20j, so no overall current flows between the contacts 2, 3.

When light is incident upon the first and second sets of semiconductor nanostructures 20a-20j which has a frequency below the first frequency threshold and above or equal to the second frequency threshold, photo-generated carrier pairs are produced in the second set of nanostructures 20f-20j but not the first set of nanostructures 20a-20e. The transfer of carriers between the first set of nanostructures 20a-20e and the film 11 causes a change to the energy band profile of the semimetal film 11. However, there is no transfer of carriers between the first set of nanostructures 20a-20e and the film 11, so the energy band profile of the film 11 has the form of that illustrated in FIG. 14 rather than that in illustrated in FIG. 15.

Carrier pairs are generated in the film 11 via resonant energy transfer, due to recombination of photo-generated electrons and holes in the first set of semiconductor nanostructures 20a-20e. The movement of those carrier pairs is influenced by the altered energy band profile of the film 11, producing a current in the film 11.

In conclusion, the sixth apparatus 105 acts as a photodetector that is only sensitive to light having a frequency within a particular band of frequencies. Advantageously, the sixth apparatus 105 operates without an electrical power source (due to the absence of an applied bias across the contacts 2, 3 in operation) and does not suffer from the losses introduced by optical filters in some photodetectors.

FIG. 16 illustrates a second method according to embodiments of the invention. At block 1601 in FIG. 16, a semiconductor nanostructure 20/120 (as illustrated in FIG. 12, 13, 14 or 15), comprising a heterojunction 21/121, generates carrier pairs 230, 231 in a semimetal film 11 via resonant energy transfer. In block 1602 in FIG. 16, the semiconductor nanostructure 20/120 generates an external electric field for separating the generated carrier pairs 230, 231 in the semimetal film 11.

Although embodiments of the present invention have been described in the preceding paragraphs with reference to various examples, it should be appreciated that modifications to the examples given can be made without departing from the scope of the invention as claimed.

For instance, in some of the examples described above, charge transfer into the film 10 reduces the conductivity of the film 10, but in other examples the conductivity of the film 10 may be increased.

It will be appreciated that carriers pairs may be generated in the film 10 via resonant energy transfer in embodiments of the invention described above in relation to FIGS. 1 to 11, but the photo-gating effect that occurs due to charge transfer between the nanostructure(s) 20 and the film 10 is orders of magnitude stronger than any direct photocurrent produced from resonant energy transfer.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus, comprising:
   a semiconductor film; and
   at least one semiconductor nanostructure comprising a heterojunction configured to modulate the conductivity of the semiconductor film by assisting photo-generated carriers to transfer into the semiconductor film from the at least one semiconductor nanostructure;
   wherein the heterojunction assists photo-generated carriers to transfer into the semiconductor film by separating them in the at least one semiconductor nanostructure.

2. An apparatus as claimed in claim 1, wherein the transfer of photo-generated carriers into the semiconductor film from the at least one semiconductor nanostructure generates an electric field which modulates the conductivity of the semiconductor film.

3. An apparatus as claimed in claim 1 wherein the heterojunction is a type-II heterojunction.

4. An apparatus as claimed in claim 1, wherein the at least one semiconductor nanostructure comprises first and second semiconductor nanomaterials that form the heterojunction, wherein the first and second semiconductor nanomaterials are arranged relative to the semiconductor film such that photo-generated carriers are transferred from the second semiconductor nanomaterial to the semiconductor film, and not from the first semiconductor nanomaterial to the semiconductor film.

5. An apparatus as claimed in claim 4, further comprising: an electrical bridge extending from the second semiconductor nanomaterial to the semiconductor film.

6. An apparatus as claimed in claim 5, wherein the electrical bridge is or comprises a metal.

7. A method, comprising:
   modulating the conductivity of a semiconductor film using a heterojunction of at least one semiconductor nanostructure; and
   causing the heterojunction to assist photo-generated carriers to transfer into the semiconductor film from the at least one semiconductor nanostructure by separating the photo-generated carriers in the at least one semiconductor nanostructure.

8. An apparatus, comprising:
   a semimetal film; and
   at least one semiconductor nanostructure, comprising a heterojunction, configured to generate carrier pairs in the semimetal film via resonant energy transfer, and configured to generate an external electric field for separating the generated carrier pairs in the semimetal film.

9. An apparatus as claimed in claim 8, wherein the heterojunction is a type-II heterojunction.

10. An apparatus as claimed in claim 8, wherein the carrier pairs in the semimetal are generated via resonant energy transfer from photo-generated carrier pairs in the at least one semiconductor nanostructure.

11. An apparatus as claimed in claim 8, wherein the heterojunction is configured to generate the external electric field by separating photo-generated carrier pairs.

12. An apparatus as claimed in claim 11, further comprising a barrier between the at least one semiconductor nanostructure and the semiconductor film, wherein the external electric field is generated by separating the photo-generated carrier pairs bound within the at least one semiconductor nanostructure by the barrier.

13. An apparatus as claimed in claim 8, wherein the at least one semiconductor nanostructure is configured to generate the external electric field by assisting photo-generated carriers to transfer into the semimetal film from the at least one semiconductor nanostructure.

14. An apparatus as claimed in claim 13, wherein the heterojunction assists photo-generated carriers to transfer into the semiconductor film by separating them in the at least one semiconductor nanostructure.

15. An apparatus as claimed in claim 8,
   further comprising at least one further semiconductor nanostructure, comprising a further heterojunction, configured to generate further carrier pairs in the semimetal film via resonant energy transfer, and configured to generate a further external electric field for separating the further generated carrier pairs in the semimetal film.

16. An apparatus as claimed in claim 15, wherein the at least one semiconductor nanostructure is configured to generate carrier pairs in the semimetal film via resonant energy transfer from photo-generated carrier pairs generated in the at least one semiconductor nanostructure in response to reception of light having a frequency equal to or above a first frequency threshold.

17. An apparatus as claimed in claim 16, wherein the at least one further semiconductor nanostructure is configured to generate further carrier pairs in the semimetal film via resonant energy transfer from photo-generated carrier pairs generated in the at least one further semiconductor nanostructure in response to reception of light having a frequency equal to or above a second frequency threshold, which is lower than the first frequency threshold.

18. An apparatus as claimed in claim 17, wherein current in the semimetal film is produced in response to reception of light by the at least one semiconductor nanostructure and the at least one further semiconductor nanostructure having a frequency below the first frequency threshold and above or equal to the second frequency threshold, and no current in the semimetal is produced in response to reception of light by the at least one semiconductor nanostructure and the at least one further semiconductor nanostructure having a frequency equal to or above the first frequency threshold and below the second frequency threshold.

19. A method, comprising:
   using at least one semiconductor nanostructure, comprising a heterojunction, to generate carrier pairs in a semimetal film via resonant energy transfer; and
   using the heterojunction to generate an external electric field for separating the generated carrier pairs in the semimetal film.

* * * * *